United States Patent
Andou et al.

(10) Patent No.: US 6,197,407 B1
(45) Date of Patent: Mar. 6, 2001

(54) CIRCUIT BOARD AND METHOD OF MANUFACTURING THE SAME

(75) Inventors: Daizou Andou; Toshio Sugawa; Tadashi Nakamura; Hideki Higashitani, all of Osaka; Masahide Tsukamoto, Nara, all of (JP)

(73) Assignee: Matsushita Electric Industrial Co., Ltd., Osaka (JP)

(*) Notice: Subject to any disclaimer, the term of this patent is extended or adjusted under 35 U.S.C. 154(b) by 0 days.

(21) Appl. No.: 09/304,714

(22) Filed: May 4, 1999

(30) Foreign Application Priority Data

| May 14, 1998 | (JP) | 10-131731 |
| Jun. 8, 1998 | (JP) | 10-159586 |
| Jun. 16, 1998 | (JP) | 10-168143 |

(51) Int. Cl.[7] .................................................. B32B 3/00
(52) U.S. Cl. .................. 428/209; 428/344; 428/901; 174/255; 174/263
(58) Field of Search .................... 428/209, 901, 428/344; 174/255, 263

(56) References Cited

U.S. PATENT DOCUMENTS

| 5,346,750 | 9/1994 | Hatakeyama et al. ............... 428/209 |
| 5,480,503 | 1/1996 | Casey et al. ........................... 156/89 |
| 5,481,795 | 1/1996 | Hatakeyama et al. ................. 29/852 |
| 5,484,647 | * 1/1996 | Nakatani et al. ..................... 428/209 |
| 5,498,467 | * 3/1996 | Meola ................................... 428/198 |
| 5,576,519 | * 11/1996 | Swamy ................................ 174/265 |
| 5,744,758 | * 4/1998 | Takenouchi et al. ................. 428/209 |

FOREIGN PATENT DOCUMENTS

| 0 568 930 | 11/1993 | (EP) . |
| 6-318783 | 11/1994 | (JP) . |
| 7 263828 | 10/1995 | (JP) . |
| 10 84186 | 9/1996 | (JP) . |
| 10 13028 | 1/1998 | (JP) . |

OTHER PUBLICATIONS

N. Fukutomi et al. "Development of Fine Line Printed Wiring Technology by Plated Wiring Pattern Transfer Method" *The Institute of Electronics, Information and Communication Engineers*, C–II, vol. J72–C–II, No. 4, pp. 243–253 (with English abstract), (No Date/Month).

* cited by examiner

Primary Examiner—Cathy Lam
(74) Attorney, Agent, or Firm—Merchant & Gould P.C.

(57) ABSTRACT

Through holes formed in an electrical insulating substrate having adhesive layers on its both surfaces are filled with a conductor. Then, supporting bases having wiring layers with a predetermined pattern are laminated on both the surfaces of the electrical insulating substrate, which are then heated and pressurized. After that, the supporting bases are removed, thus obtaining a circuit board in which the wiring layers have been embedded in the adhesive layers. The conductor within the through holes are compressed sufficiently, thus forming minute via holes with high reliability.

13 Claims, 8 Drawing Sheets

CIRCUIT BOARD AND METHOD OF MANUFACTURING THE SAME

FIELD OF THE INVENTION

The present invention relates to a circuit board in which layers are electrically connected using a conductor such as a conductive paste and to a method of manufacturing the same.

BACKGROUND OF THE INVENTION

Recently, the applicant has proposed a multilayer circuit board in which layers are electrically connected using a conductive paste (in Japanese Patent No. 2,601,128). FIG. 8 shows a method of manufacturing the multilayer circuit board. As shown in FIG. 8(a), release films 501 made of polyester or the like are laminated on both surfaces of a porous substrate 502 obtained by impregnating aromatic polyamide fibers with a thermosetting epoxy resin. As shown in FIG. 8(b), through holes 503 are formed at predetermined positions in the porous substrate 502 by a laser processing method. Then, the through holes 503 are filled with a conductive paste 504 as shown in FIG. 8(c). As a filling method, the porous substrate 502 with the through holes 503 is placed on a table of a screen printing machine and the conductive paste 504 is printed directly from the top of one of the release films 501. In this case, the release film 501 at the printed side serves as a print mask and to prevent the surface of the porous substrate 502 from being polluted. Then, the release films 501 are peeled off from both the surfaces of the porous substrate 502. As a next step, metal foils 505 such as copper foils are laminated on both the surfaces of the porous substrate 502. In this state, it is heated and pressurized, thus bonding the porous substrate 502 and the metal foils 505 as shown in FIG. 8(d). In this process, the porous substrate 502 is compressed to be made thin. Simultaneously, the conductive paste 504 within the through holes 503 also is compressed, and a binder constituent contained in the conductive paste 504 is forced out, thus strengthening the adhesion between conductive constituents and between the conductive constituents and the metal foils 505. As a result, the conductive material contained in the conductive paste 504 becomes dense, and thus layers are electrically connected to each other. After that, a thermosetting resin that is a constituent of the porous substrate 502 and the conductive paste 504 are cured. Finally, as shown in FIG. 8(e), the metal foils 505 are selectively etched in a predetermined pattern, thus completing a double-faced circuit board.

However, in the aforementioned configuration and manufacturing method, when the through holes 503 are formed to be minute, the initial connection resistance increases and greatly varies. Further, the connection resistance varies depending on reliability tests such as a temperature cycling test or a pressure cooker test, which has been a problem. The problem is caused by the aspect ratio, which is the ratio of the diameter of the through holes 503 and the thickness of the porous substrate 502, approaches 1 when the through holes 503 are formed to be minute, and therefore the compressibility required for stabilizing the electric connection cannot be obtained.

In the process of peeling off the release films 501, when the through holes are decreased in diameter, the influence of the release film cannot be ignored at the ends of the through holes. In peeling off the release films, the conductive paste 504 is removed by the release films, thus preventing the through holes from being filled with the conductive paste, which has been another problem.

SUMMARY OF THE INVENTION

Bearing the aforementioned problems in mind, the present invention aims to provide a circuit board that enables minute via holes to be obtained with high reliability using a conductive material such as a conductive paste and a method of manufacturing the same.

In order to solve the aforementioned problems, in a circuit board of the present invention, through holes formed in a thickness direction of an electrical insulating substrate are filled with a conductor, and wiring layers formed on both the surfaces of the electrical insulating substrate in a predetermined pattern are electrically connected by the conductor. The circuit board is characterized in that adhesive layers are formed on both the surfaces of the electrical insulating substrate and at least one wiring layer is embedded in one of the adhesive layers. In such a configuration, the conductor within the through holes is compressed sufficiently and thus minute via holes can be formed with high reliability. That is to say, since at least one wiring layer is embedded in one of the adhesive layers, the conductor within the through holes is compressed sufficiently. As a result, a conductive constituent of the conductor becomes dense, thus enabling via-hole connection with a low initial connection resistance and high reliability.

It is preferred to use a conductive paste as the conductor, since a resin constituent contained in the conductive paste is forced out from the through holes when the conductive paste within the through holes is compressed and the conductive constituent contained in the conductive paste becomes dense, thus obtaining the via-hole connection with a low initial connection resistance and high reliability more easily.

When the through holes in the topmost layer are covered with a wiring layer, the conductor filling the through holes is not exposed at the surface. Consequently, it is effective to provide such through holes to the top layer of a substrate.

When the wiring layers are formed so that a part of the respective through holes is exposed and such wiring layers are used as inner layers, landless via holes in which via holes are compressed by a smaller wiring than the diameter of the via holes can be obtained. Thus, further minute wiring can be formed.

When at least the surface of each wiring layer facing the through holes is processed to be rough, the contact area between the wiring layer and the conductor increases, and the adhesion between the wiring layer and the adhesive layer also is increased. Therefore, the process is effective for further improving the reliability of minute via holes.

A first method of manufacturing a circuit board according to the present invention comprises: providing through holes in an electrical insulating substrate having adhesive layers formed on its both surfaces; filling the through holes with a conductive paste; superposing a supporting base, on which a wiring layer has been formed in a predetermined pattern, at least on one surface of the electrical insulating substrate; embedding the wiring layer in an adhesive layer by compressing the electrical insulating substrate, on which the supporting base has been superposed, by heating and pressurization; and removing the supporting base while leaving the wiring layer. The method enables a circuit board with via holes having high reliability in connection with a minute wiring layer to be provided by such an easy method that the patterned wiring layer is supported by the laminated supporting base that is removed after press.

A second method of manufacturing a circuit board according to the present invention comprises: laminating release films, each of which has an adhesive layer on its one surface, on both surfaces of an electrical insulating substrate so that each surface of the electrical insulating substrate comes into contact with the adhesive layer; providing through holes in the electrical insulating substrate having the release films; filling the through holes with a conductive paste; peeling off the release films while leaving the adhesive layers in the electrical insulating substrate; superposing a supporting base, on which a wiring layer has been formed in a predetermined pattern, at least on one surface of the electrical insulating substrate; embedding the wiring layer in the adhesive layer by compressing the electrical insulating substrate on which the supporting base has been superposed by heating and pressurization; and removing the supporting base while leaving the wiring layer. This method can avoid such a difficulty in manufacture as to form thin semi-cured adhesive layers on both surfaces of an electrical insulating substrate simultaneously. By such an easy method in which a supporting base on which a wiring layer has been formed is laminated and pressed and then is removed, a circuit board with via holes having high reliability in connection with a minute wiring layer can be provided.

In the aforementioned first or second manufacturing method, when the electrical insulating substrate before being heated and pressurized is a composite material of a semi-cured thermosetting resin and a glass woven fabric and the adhesive layers are formed of the thermosetting resin, a conventional glass epoxy composite material can be used. Therefore, an extra step for providing the adhesive layer is not necessary, resulting in easy manufacture of a circuit board.

The electrical insulating substrate before being heated and pressurized may be formed of a film comprising an organic material as a main constituent and the adhesive layers may be formed of a semi-cured organic resin. By selecting a material having high heat resistance and high stiffness as a film material, characteristics suitable for mounting semiconductors can be provided. The material of the adhesive layer can be freely selected considering electric insulation and a property capable of receiving an object to be embedded. Thus, a circuit board with high performance can be obtained. Furthermore, a thin film with a uniform composition can be produced, which is convenient for forming via holes with a minute diameter.

When the thickness of the adhesive layer provided on the surface of the electrical insulating substrate before being heated and pressurized is substantially the same as or thinner than that of the wiring layer to be embedded in the adhesive layer, the wiring layer can be embedded so as almost to reach the electrical insulating substrate, thus minimizing the decrease in compressive force to the conductive paste due to spread of the adhesive layer in the horizontal direction when being compressed.

When the electrical insulating substrate before being heated and pressurized has spaces capable of receiving constituent materials of the adhesive layers, the electrical insulating substrate receives the constituent materials of the adhesive layers that have been melted by being heated and pressurized. Consequently, distortion of the electrical insulating substrate that is caused by embedding the wiring layer can be restrained.

When the electrical insulating substrate before being heated and pressurized has minute pores through which the constituent materials of the adhesive layers provided on both the surfaces of the electrical insulating substrate can pass, the constituent materials of the adhesive layers that have been melted by being heated and pressurized can flow up and down in the electrical insulating substrate. As a result, the distortion of the electrical insulating substrate can be restrained further.

It is preferable that in the process of removing the supporting base while leaving the wiring layer, the supporting base is selectively melted and removed. By melting and removing the supporting base, a mechanical external force is not applied to the wiring layer. Therefore, a circuit board having a minute wiring layer that is not disconnected or deformed can be manufactured with a good yield. In addition, even a circuit board having a large area can be manufactured easily.

In the aforementioned first or second method of manufacturing a circuit board, it is preferable that the wiring layer and the supporting base are formed of respective materials that enable them to be removed selectively. According to this configuration, after embedding the wiring layer in the adhesive layer, the supporting base can be removed easily while leaving only the wiring layer.

In this case, it is preferable that the wiring layer and the supporting base are formed so as to be removed selectively by different etchants. This configuration prevents the wiring layer from being removed simultaneously by over-etching when removing the supporting base by etching after embedding the wiring layer in the adhesive layer. Therefore, the wiring layer having a minute pattern can be left in the adhesive layer with a good yield. Further, a sufficient difference in etching speed, for example, a difference of about several times is enough for removing one of them selectively by etching.

Further, in the first or second method of manufacturing a circuit board, it is preferable that at least one etching-stopper layer is formed on the surface of the supporting base, a wiring layer is provided on the surface of the etching-stopper layer, and the wiring layer and at least the etching-stopper layer are formed of respective materials that enable them to be removed selectively. According to this configuration, selectivity in removing only one selected from the supporting base and the wiring layer by etching can be improved. As a result, after embedding the wiring layer in the adhesive layer, the supporting base can be removed easily while leaving only the wiring layer. More particularly, in removing the supporting base by etching, the wiring layer can be prevented from being removed simultaneously due to over-etching. Therefore, the wiring layer having a minute pattern can be left in the adhesive layer with a good yield.

In this case, it is preferable that at least the wiring layer and the etching-stopper layer are formed so as to be removed selectively by different etchants. According to this configuration, even if the supporting base and the wiring layer are formed of respective materials that are removed by the same etchant, etching with an etchant capable of removing only the etching-stopper layer selectively enables the supporting base to be removed together with the etching-stopper layer, thus leaving only the wiring layer.

In the first or second method of manufacturing a circuit board, it is preferable that the supporting base on which the wiring layer has been formed is obtained by: forming an insulating-material pattern on the surface of the supporting base or the surface of the etching-stopper layer formed on the supporting base; and forming a wiring layer with a desired pattern by allowing a conductive material to adhere by plating to the area where the surface of the supporting base or the surface of the etching-stopper layer is exposed. According to such a configuration, a wiring layer with a desired pattern can be obtained easily.

In this case, the insulating-material pattern can be formed by allowing a photosensitive resin to adhere to the surface of the supporting base or the surface of the etching-stopper layer, then exposing it selectively according to the desired mask pattern, and developing it. Thus, a desired insulating-material pattern can be formed easily in a desired area.

When the "plating" is electroplating, a conductive material easily can adhere selectively only to the exposed area where no insulating-material pattern has been formed. Consequently, a desired minute wiring pattern can be formed easily.

In the first or second method of manufacturing a circuit board, it is preferable that the supporting base on which the wiring layer has been formed is obtained by: laminating a substrate on the back surface of the supporting base using an adhesive that loses its adhesion at a predetermined temperature or higher; and forming a wiring layer on the surface of the supporting base directly or with an etching-stopper layer being sandwiched therebetween. Even if the supporting base is a thin film member, it can be reinforced by laminating the substrate having a sufficient strength for supporting the supporting base. When the wiring layer is formed after that, the process of forming the wiring layer can be carried out easily. In addition, by laminating the substrate using the adhesive that loses its adhesion at a predetermined temperature or higher, the supporting base and the substrate can be separated easily by heating after predetermined processes. As a result, the working efficiency is improved.

A multilayer circuit board according to a first configuration of the present invention is formed by laminating at least two electrical insulating substrates with an adhesive layer being sandwiched therebetween. The electrical insulating substrates have through holes formed in the thickness direction and filled with a conductor. The multilayer circuit board is characterized in that a wiring layer formed in a predetermined pattern is provided in the adhesive layer and the wiring layer is electrically connected to the conductors in both the electrical insulating substrates sandwiching the adhesive layer due to a compressive force applied in the laminated direction. According to such a configuration, a multilayer circuit board with minute via holes having high reliability can be provided.

A first method of manufacturing a multilayer circuit board according to the present invention is characterized by repeating the steps of: superposing a supporting base, on which a wiring layer has been formed in a predetermined pattern, on one surface of an electrical insulating substrate that has through holes filled with a conductive paste and adhesive layers on its both surfaces; embedding the wiring layer in an adhesive layer by applying a compressive force by heating and pressurization; and removing the supporting base while leaving the wiring layer. According to such a configuration, a simple method of manufacturing a multilayer circuit board can be provided.

In the aforementioned first method of manufacturing a multilayer circuit board, it is preferable that the wiring layer and the supporting base are formed of respective materials that enable them to be removed selectively. It also is preferable that at least one etching-stopper layer is formed on the surface of the supporting base, a wiring layer is provided on the surface of the etching-stopper layer, and the wiring layer and at least the etching-stopper layer are formed of respective materials that enable them to be removed selectively. Furthermore, it is preferable that the supporting base on which the wiring layer has been formed is obtained by: forming an insulating-material pattern on the surface of the supporting base or the surface of the etching-stopper layer formed on the surface of the supporting base; and forming a wiring layer with a desired pattern by allowing a conductive material to adhere by plating to the area where the surface of the supporting base or the surface of the etching-stopper layer is exposed. In addition, it is preferable that the supporting base on which the wiring layer has been formed is obtained by: laminating a substrate on the back surface of the supporting base using an adhesive that loses its adhesion at a predetermined temperature or higher; and forming a wiring layer on the surface of the supporting base directly or with an etching-stopper layer being sandwiched therebetween. The aforementioned methods are preferable due to the same reasons as those in the case of the first or second method of manufacturing a circuit board.

A multilayer circuit board according to a second configuration of the present invention is characterized in that the wiring layer formed of the top layer of the multilayer circuit board according to the first configuration of the present invention and a wiring layer of the top layer of a core substrate having a predetermined number of insulating layers and wiring layers are electrically connected with an electrical insulating substrate, which has adhesive layers on its both surfaces and through holes filled with a conductor, being sandwiched therebetween, and at least one selected from the wiring layer of the top layer of the multilayer circuit board and the wiring layer of the top layer of the core substrate is embedded in an adhesive layer. According to such a configuration, a multilayer circuit board in which the wiring layer of the top layer of the core substrate and the wiring layer of the top layer of the first multilayer circuit board formed of a plurality of layers having minute via holes and minute wiring are electrically connected can be provided.

A second method of manufacturing a multilayer circuit board according to the present invention is characterized by comprising: superposing the multilayer circuit board according to the first configuration of the present invention on a core substrate having a predetermined number of insulating layers and wiring layers with an electrical insulating substrate, which has adhesive layers on its both surfaces and through holes filled with a conductive paste, being sandwiched therebetween; and embedding at least one selected from the wiring layer formed on the top layer of the multilayer circuit board and the wiring layer of the top layer of the core substrate in an adhesive layer by heating and pressurizing the core substrate and the multilayer circuit board that have been superposed with the electrical insulating substrate being sandwiched therebetween. According to such a configuration, a simple method of manufacturing a multilayer circuit board can be provided.

In the first or second method of manufacturing a multilayer circuit board, the electrical insulating substrate before being heated and pressurized may be a composite material of a semi-cured thermosetting resin and a glass woven fabric, and the adhesive layer may be formed of the thermosetting resin. Alternatively, the electrical insulating substrate before being heated and pressurized may be formed of a film comprising an organic material as a main constituent, and the adhesive layer may be formed of a semi-cured organic resin.

In the first or second method of manufacturing a multilayer circuit board, it is preferable that the thickness of each adhesive layer provided on the surfaces of the electrical insulating substrate before being heated and pressurized is substantially the same as or thinner than that of the wiring layer to be embedded in the adhesive layer.

In the first or second method of manufacturing a multilayer circuit board, it is preferable that the electrical insulating substrate before being heated and pressurized has spaces capable of receiving constituent materials of the adhesive layers. It is further preferable that the electrical insulating substrate before being heated and pressurized has minute pores through which the constituent materials of the adhesive layers can pass.

Furthermore, a multilayer circuit board according to a third configuration of the present invention is characterized in that the multilayer circuit board according to the first configuration of the present invention and a core substrate having a predetermined number of insulating layers and wiring layers are laminated with a substrate bonding body having through holes filled with a conductor being sandwiched therebetween, the wiring layer formed on the top layer of the multilayer circuit board and the wiring layer of the top layer of the core substrate are electrically connected via the conductor, and the substrate bonding body before being laminated has compressibility. According to such a configuration, a multilayer circuit board in which the wiring layer of the core substrate and the wiring layer of the first multilayer circuit board formed of a plurality of layers having minute wiring and minute via holes are electrically connected can be provided.

In the above, "the substrate bonding body has compressibility" means that, for example, the substrate bonding body is formed of a porous substrate having holes inside and thus has a property of being able to be compressed. In the case of using the porous substrate, a preferable porosity is 2–35% by volume. When the porosity is lower than that, the substrate bonding body is difficult to be compressed, thus causing increase in the electric connection resistance between the conductor and the wiring layer or a bad connection. On the other hand, when the porosity is higher than that, the substrate bonding body is further deformed in the vertical direction to the compression direction when being compressed and the conductive resin enters into the holes. Consequently, the conductive resin cannot be compressed sufficiently, thus increasing the electric connection resistance between the conductor and the wiring layer.

In the aforementioned third multilayer circuit board, it is preferable that the material forming the substrate bonding body is at least one material selected from resin-impregnated fiber sheet materials composed of a composite material of a glass-fiber nonwoven fabric or an organic-fiber nonwoven fabric, and a thermosetting resin. According to such a preferable configuration, electric and mechanical characteristics of the multilayer circuit board are further improved.

A third method of manufacturing a multilayer circuit board according to the present invention is characterized by comprising: superposing the multilayer circuit board according to the first configuration of the present invention on a core substrate with a predetermined number of insulating layers and wiring layers with a substrate bonding body that has through holes filled with a conductive paste and has compressibility being sandwiched therebetween; and electrically connecting the wiring layer formed on the top layer of the multilayer circuit board and the wiring layer of the core substrate via the conductive paste by heating and pressurizing the multilayer circuit board and the core substrate that have been superposed with the substrate bonding body being sandwiched therebetween. Such a configuration enables a simple method of manufacturing a multilayer circuit board to be provided.

In the aforementioned third method of manufacturing a multilayer circuit board, it is preferable that the conductive paste filling the through holes in the substrate bonding body before being heated and pressurized protrudes from the surfaces of the substrate bonding body. According to such a preferable configuration, the both wiring layers can be electrically connected to each other stably via the conductive paste with a low resistance.

DETAILED DESCRIPTION OF THE INVENTION EXAMPLES

Figure 1:
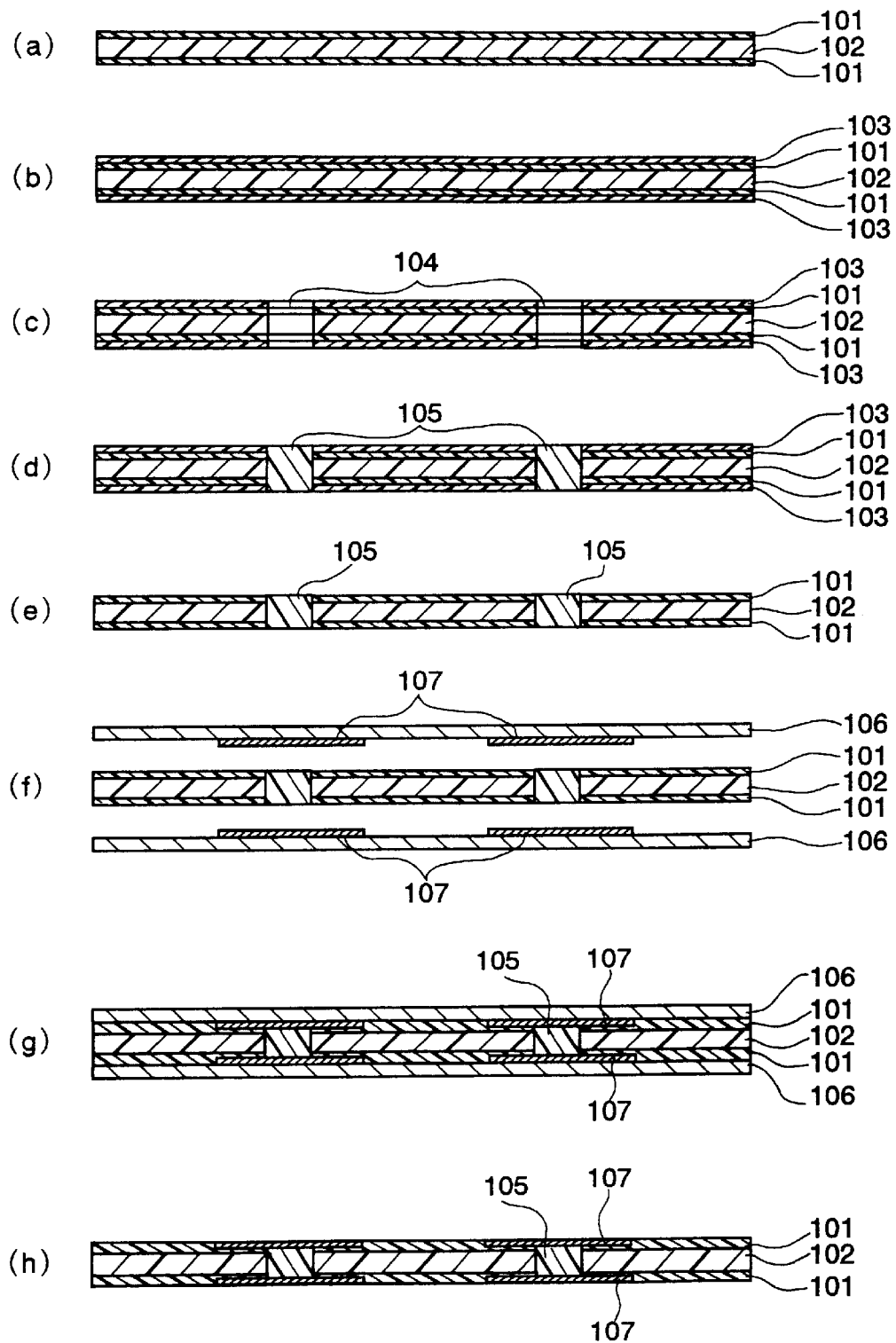
FIGS. 1(a)–(h) show cross-sectional views illustrating steps in a method of manufacturing a double-faced circuit board in a first example of the present invention.

Examples of the present invention will be explained with reference to the drawings as follows.

First Example

FIGS. 1(a)–(e) show cross-sectional views illustrating steps in a method of manufacturing a double-faced circuit board according to a first example of the present invention.

As shown in FIG. 1(a), an electrical insulating substrate 102 with adhesive layers 101 formed on both of its surfaces was prepared.

As the electrical insulating substrate 102, one with excellent dimensional stability and high heat-resistance is used. Films of this kind include a polyimide film, an aramid film, and the like. Polyimide films include "KAPTON" (a trademark of Du Pont-Toray Co., Ltd.), "UPILEX " (a trademark of Ube Industries, Ltd.), and "APICAL" (a trademark of KANEKA CORPORATION). Such polyimide films are characterized by having low water absorption depending on their grade. Aramid films include "ARAMICA" (a trademark of ASAHI CHEMICAL INDUSTRY CO., LTD.) and "MICTRON" (a trademark of TORAY INDUSTRIES, INC.). Such aramide films are characterized by having higher stiffness and being difficult to be elongated compared to the polyimide films.

As the adhesive layers 101, an epoxy adhesive or an imide adhesive was used as an example of a thermosetting resin and a silicon adhesive of a high grade in heat-resistance as an example of a thermoplastic adhesive. It is preferred to prepare a thermosetting resin in a semi-cured state for ensuring that a wiring layer can be embedded therein.

In the present example, an "ARAMICA" film with a thickness of 12 μm was used as the electrical insulating substrate 102 and an epoxy resin modified with rubber as the adhesive layers 101. The epoxy resin was modified with rubber so as to have good conformability with the film substrate. The epoxy resin was applied onto the substrate 102 and was then dried so as to be in a semi-cured state for ensuring that a pattern can be embedded therein. Each adhesive layer had a thickness of 5 μm.

As shown in FIG. 1(b), release films 103 such as polyester films were laminated on both the adhesive layers 101 formed on the substrate 102 at about 80° C. Consequently, the surfaces of the adhesive layers 101 were melted slightly, thus permitting the release films 103 to adhere onto the adhesive layers 101. In the present example, polyethylene terephthalate (PET) films having a thickness of 16 μm were used as the release films 103. The total thickness including the release films 103 was 54 μm in this stage.

Then, as shown in FIG. 1(c), through holes 104 were formed in the substrate 102 provided with the release films 103 by a laser. As the laser, a short wavelength laser such as an excimer laser with a wave length of 307 nm or a YAG THG (Third Harmonic Generation) laser with a wave length of 355 nm was used. The through holes 104 with a diameter of about 50 μm were formed by the short wavelength laser.

As shown in FIG. 1(d), the through holes 104 were filled with a conductive paste 105 by printing the conductive paste 105 directly from the top of a release film 103 using a screen printing machine. In this case, vacuum adsorption from the side opposite to the printed surface via a porous sheet such as Japanese paper permitted a resinous constituent contained in the conductive paste 105 within the through holes 104 to be absorbed, thus increasing the proportion of a conductive constituent. As a result, the through holes 104 were filled with the conductive paste containing the denser conductive constituent. In addition, the release film 103 served as a print mask and a pollution controller for the surface of the adhesive layer 101. In this case, the hole diameter and the total thickness were 50 μm and 54 μm respectively, and therefore the aspect ratio was one or less. However, the through holes 104 could be filled with the conductive paste by the above mentioned method unless the aspect ratio is less than about 0.3, i.e. the hole diameter is smaller than about 20 μm.

As shown in FIG. 1(e), the release films 103 were peeled off from the both surfaces. In this case, due to the minute through holes 104 with a diameter of 50 μm the influence at the ends could not be ignored. Consequently, the conductive paste within the through holes 104 in the release films 103 was removed together with the release films 103. The conductive paste 105 remained within the through holes 104 in various states. However, the remaining conductive paste 105 had no scoop below the surfaces of the adhesive layers 101. Even in the worst case, the adhesive layers 101 were merely worn out (i.e. the upper and lower surfaces of the conductive paste 105 were substantially at the same level as the respective surfaces of the adhesive layers 101). Such removal of the conductive paste by the release films 103 was found significantly when the hole diameter was decreased to 100 μm or less.

As shown in FIG. 1(f), aluminum-foil supporting bases 106 with wiring layers 107 obtained by forming copper foils in a predetermined shape were superposed from both sides of the substrate 102 with at least the wiring layers 107 being positioned right above the through holes 104 filled with the conductive paste 105, which was then heated and pressurized by vacuum press.

The heating and pressurization allowed the adhesive layers 101 to flow and thus the wiring layers 107 were embedded in the adhesive layers 101 as shown in FIG. 1(g). By embedding the wiring layers 107 in the adhesive layers 101 in such a manner, the conductive paste 105 within the through holes 104 was compressed, and the resinous constituent contained in the conductive paste 105 flowed out in the adhesive layers 101. The conductive constituent contained in the conductive paste 105 became dense, thus electrically connecting the wiring layers 107 positioned on both sides of the substrate 102 to each other. After that, the adhesive layers 101 and the conductive paste 105 were cured.

As the last step, the supporting bases 106 were removed while leaving the wiring layers 107 embedded in the adhesive layers 101 as shown in FIG. 1(h), thus completing a double-faced circuit board. In the present example, aluminum foils were used for the supporting bases 106, and copper foils were used for the wiring layers 107. The supporting bases 106 were removed by melting the aluminum foils by selective etching of the aluminum foils and the copper foils. Since the supporting bases 106 were removed by melting the aluminum foils, the double-faced circuit board was not stressed and thus was not broken. In addition, the supporting bases 106 were removed in a single line, thus improving the productivity. As an etchant for the selective etching, ammonium persulfate or the like can be used. The same method was applied to form the wiring layers 107 in a predetermined pattern. Composite materials of aluminum foil and copper foil include, for example, a copper foil with an aluminum carrier, UTC-Foil, manufactured by Mitsui Mining & Smelting Co., Ltd. The composite material enables fine pattern formation, since the copper foil is thin with a thickness of 5 μm or 9 μm.

The same composite material was obtained by preforming a resist pattern on an aluminum foil, treating it with acidic zincate, and then conducting copper electroplating. In the electroplating method, one having a thick copper foil and a fine pattern was obtained. In this method, one having a space of 10 μm, a linewidth of 10 μm, and a copper foil with a thickness of 15 μm was produced experimentally.

The copper foil used in the present example had a thickness of 9 μm. Each adhesive layer 101 had a thickness of 5 μm, which was set to be thinner than the copper foil. An "ARAMICA" film with a thickness of 12 μm was used as the substrate 102, and epoxy adhesive layers with a thickness of 5 μm were used as the adhesive layers 101. Therefore, the conductive paste 105 had a thickness of 22 μm before the wiring layers 107 were embedded. Copper foils with a thickness of 9 μm were embedded in the conductive layers 101 as the wiring layers 107, thus obtaining a compressibility of 18/22=about 82%. Actually, the conductive paste with a maximum thickness of that of the release films 103 protrudes from the surfaces of the adhesive layers 101. Consequently, the compressibility corresponding to the thickness was added and was therefore further increased. The volume ratio of the resinous constituent and the conductive constituent in the conductive paste 105 was set to about 50% considering print quality. Therefore, most of the resinous constituent in the conductive paste 105 within the through holes 104 was pressed out in the adhesive layers, and the conductive constituent became dense within the through holes 104, thus obtaining via holes with low resistance and high reliability. From experiments, when the volume compressibility was at least 20%, electric connection with low resistance could be obtained, thus improving the connection reliability. Further, the thickness of the adhesive layers 101 was set to be substantially the same as or thinner than that of the wiring layers 107. Therefore, in forcing the wiring layers 107 into the adhesive layers 101, the through holes 104 in the adhesive layers 101 were not increased in diameter, which prevents the compressive force from being lost in the horizontal direction. As a result, the conductive paste 105 was compressed. At that time, the substrate 102 was hardly changed in size. Consequently, most of the pressure by press acted on the inside of the through holes in the vertical direction, thus compressing the conductive paste 105.

One surface, which was to be brought into contact with the conductive paste 105, of each copper foil used as the wiring layers 107 was treated to be rough. Therefore, the adhesion between the adhesive layers 101 and the copper foils increased, thus improving the peel strength. Furthermore, the contact area between the copper foils and the conductive paste 105 also increased, thus improving the connection reliability.

In the above-mentioned example, the adhesive layers 101 were provided on both the surfaces of the substrate 102. However, a release film 103 provided with an adhesive layer 101 may be laminated on each surface of the substrate 102. In such a manufacturing method, the adhesive layer 101 is applied onto one surface of the release film 103 and then can be dried in a semi-cured state. Therefore, the adhesive layers 101 were formed on both the surfaces of the substrate 102 in an easier manner than that by the steps of applying the adhesive layers 101 on both the surfaces of the substrate 102 simultaneously and drying them in a semi-cured state.

Furthermore, FIG. 1 illustrates the aforementioned configuration in which the wiring layers 107 cover the through holes 104. However, the wiring layers 107 are not required to cover the through holes 104 completely. The wiring layers 107 may cover a part of the respective through holes, since the wiring layers 107 only are required to be embedded so that a predetermined compressibility is obtained between the wiring layers within the through holes. In other words, a part of the respective through holes may be exposed as long as the wiring layers are positioned on and beneath the conductive paste so as to compress the conductive paste within the through holes. In the present example, for instance, when using through holes with a diameter of 50 $\mu$m and a wiring with a width of 30 $\mu$m, the conductive pastes were compressed, thus electrically connecting the wiring layers to each other. Such a configuration does not require a so-called land, resulting in the formation of further minute wiring. The above-mentioned configuration is effective particularly when being applied to inner layers of a multilayer circuit board.

In the aforementioned example, a highly heat-resistant film was used as the substrate 102 and a thermosetting resin or a thermoplastic resin was used as the adhesive layers 101. However, the same configuration can be also obtained by replacing them with a glass epoxy pre-preg. That is to say, a composite material of a glass woven fabric and a semi-cured thermosetting resin can be used as the electrical insulating substrate, and thermosetting resin layers made of the same thermosetting resin as the resin with which the electrical insulating substrate is impregnated can be used as the adhesive layers. The glass epoxy pre-preg does not require the extra formation of the adhesive layers. When the glass woven fabric is impregnated with the thermosetting resin, thermosetting-resin layers are formed on the upper and lower surfaces of the glass woven fabric spontaneously. Therefore, the present invention can be carried out more easily.

An example of a method of manufacturing the supporting bases 106 provided with the wiring layers 107 that were used in the above-mentioned example will be explained with reference to FIGS. 2(a)–(d) as follows.

As shown in FIG. 2(a), a copper foil with an aluminum carrier, UTC-Foil, manufactured by Mitsui Mining & Smelting Co., Ltd. in which a metal layer 110 made of copper used for forming a wiring layer was laminated on a surface of a supporting base 106 made of aluminum was prepared. Such a composite material also can be formed by electroplating, depositing, or bonding copper to an aluminum foil. In this case, considering the removal (etching removal) of the supporting base 106 by being melted in a later process, it is preferable that the supporting base 106 is thin with a thickness of about 1 mm or less. However, to the contrary, an excessively thin supporting base 106 causes handling difficulty. Therefore, it is preferable that the supporting base 106 has a thickness of at least 5 $\mu$m. The supporting base 106 used in the present example had a thickness of about 50 $\mu$m. It is important that the supporting base 106 is thin so as to be removed by etching easily. However, even if the supporting base 106 has a thickness of about 50 $\mu$m, it often is wrinkled or folded depending on a handling manner.

In the present example, for the purpose of easy handling, the supporting base 106 was reinforced by bonding a substrate 113 to the surface of the supporting base 106, on which the metal layer 110 had not been formed, using an adhesive 114 as shown in FIG. 2(b). The substrate 113 was formed of a polyethylene terephthalate (PET) film having a proper strength and relatively high acid resistance and alkali resistance. As the adhesive 114, one whose adhesion was substantially decreased or lost at a predetermined temperature or higher was used. The adhesive 114 in the present invention contains a foaming agent that foams at a predetermined temperature or higher. As the substrate 113 onto which the adhesive 114 adheres, for example, "Thermal Release Sheet 'REV ALPHA'" (a trademark of NITRO DENS CORPORATION) is available on the market.

As a next step, the metal layer 110 was photo-etched to form a wiring layer 107 made of copper having a predetermined pattern (FIG. 2(c)). In this case, a liquid resist was used as a photo resist for the photo-etching. A film resist also can be used, but the liquid resist enables a more minute pattern to be formed. Further, the etchant used for the aluminum forming the supporting base 106 and that used for the copper of the metal layer 110 for forming the wiring layer 107 are different. Therefore, the selection of appropriate etchants for respective metal materials enabled each metal to be etched selectively. In this case, since a normally used copper-chloride or copper-sulfate etchant etches not only copper but also aluminum, a sodium persulfate or ammonium persulfate etchant that does not etch aluminum was selected as the etchant used for the pattern formation using copper, thus selectively etching only the copper. Consequently, even if the copper was over-etched in etching for the pattern formation, the aluminum of the supporting base 106 was not etched.

On the other hand, aluminum can be etched easily by a hydrochloric acid solution (for example, with a ratio of hydrochloric acid:water=1:1), but the copper of the wiring layer 107 is not etched by this solution.

After the pattern formation, the copper surface may be treated, for example, so as to be made rough.

Generally, in removing the resist after etching unwanted areas of the metal layer 110 made of copper, a sodium carbonate alkaline solution is used for the removal of the film resist and a sodium hydroxide alkaline solution or the like is used for the removal of the liquid resist. These solutions etch the aluminum of the supporting base 106 slightly. However, since the substrate 113 having acid resistance and alkali resistance is bonded to the supporting base 106 using the adhesive 114, the supporting base 106 is not etched.

After that, it was heated at least to the temperature at which the foaming agent contained in the adhesive 114 foamed. Consequently, the foaming agent foamed and thus the adhesive 114 lost its adhesion. As a result, the substrate 113 was easily peeled off, thus obtaining the supporting base 106 made of aluminum on which the wiring layer 107 made of copper had been formed in a desired pattern (FIG. 2(d)).

In the above, the heating temperature can be selected from a range of 90° C.–180° C. Depending on the foaming agent. However, a proper temperature is about 150° C., since the foaming agent can fully withstand 150° C. In a baking step of the photo-resist and the temperature of about 150° C. Prevents the aluminum of the supporting base 106 and the copper of the wiring layers 107 from being deteriorated due to thermal oxidation caused by the foaming temperature.

In the above example, a PET film was used as the substrate 113. However, other organic materials, glass, or stainless steel may be used as long as it has a proper strength and relatively high acid resistance and alkali resistance.

Second Example

A method of manufacturing a double-faced circuit board according to a second example of the present invention will be explained with reference to FIGS. 3(a)–(d).

Figure 3:
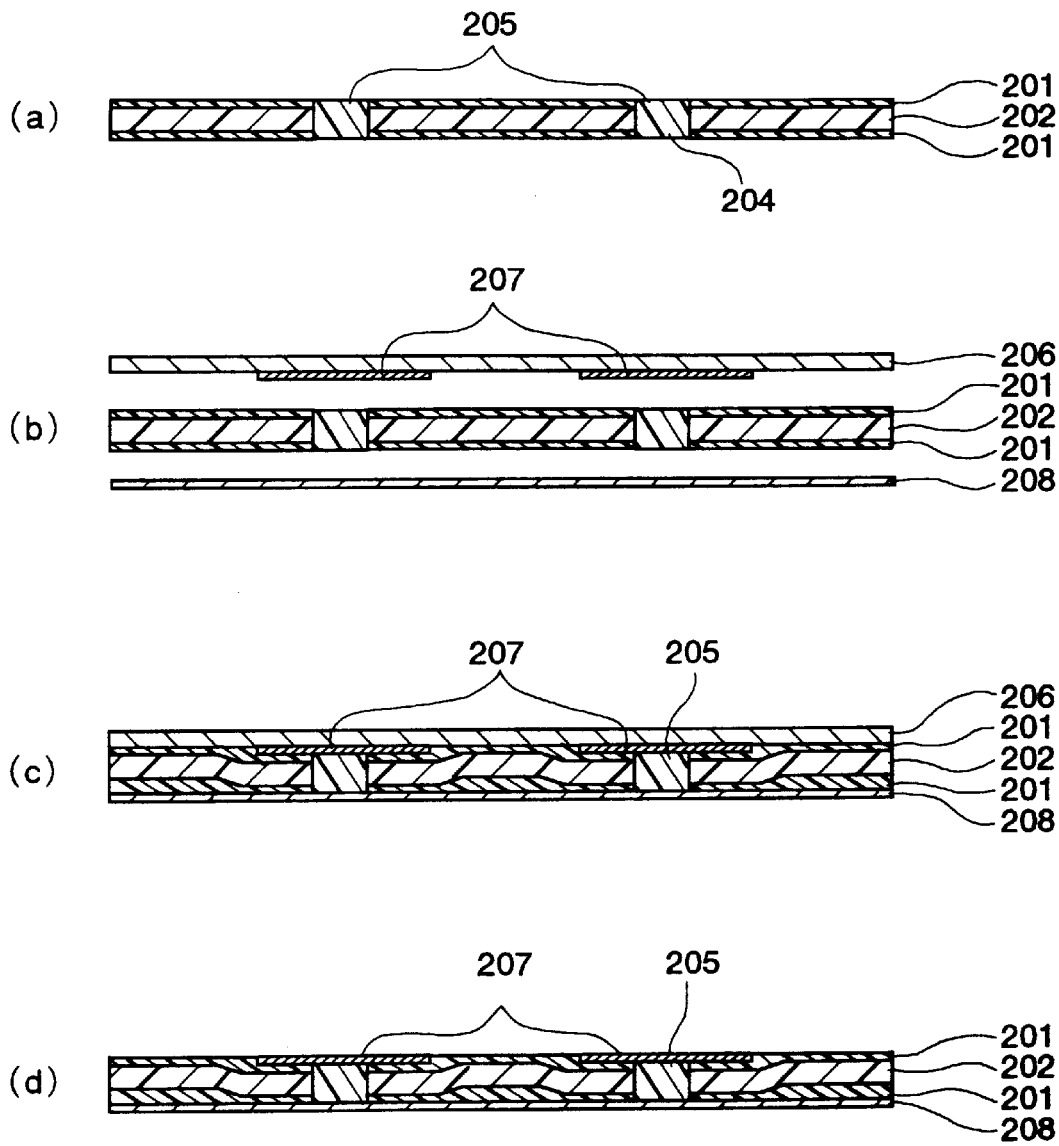
FIGS. 3(a)–(d) show cross-sectional views illustrating steps in a method of manufacturing a double-faced circuit board in a second example of the present invention.

As shown in FIG. 3(a), through holes 204 were formed in an electrical insulating substrate 202 having adhesive layers 201 formed on its both surfaces and were filled with a conductive paste 205 as in the first example. Then, as shown in FIG. 3(b), a supporting base 206 provided with a wiring layer 207 formed in a predetermined form was superposed from one side of the substrate 202 so that at least the wiring layer 207 was positioned right above the through holes 204 filled with the conductive paste 205, and a copper foil 208 was superposed from the other side, which was then heated and pressurized by vacuum press. The heating and pressurization allowed the adhesive layers 201 to flow and thus the wiring layer 207 was embedded in the adhesive layer 201 on which the supporting base 206 had been superposed as shown in FIG. 3(c). By embedding the wiring layer 207 in the adhesive layer 201 in such a manner, the substrate 202 was deformed. The conductive paste 205 within the through holes 204 was compressed, and a resinous constituent contained in the conductive paste 205 flowed out in the adhesive layers 201. Therefore, the conductive constituent contained in the conductive paste 205 became dense, thus electrically connecting the wiring layer 207 positioned on one side and the copper foil 208 on the other side of the substrate 202. After that, the adhesive layers 201 and the conductive paste 205 were cured. As the last step, the supporting base 206 was removed while leaving the wiring layer 207 embedded in the adhesive layer 201 as shown in FIG. 3(d), thus completing a double-faced circuit board. The present example differs from the first example in that the conductive paste 205 is compressed from one side of the substrate 202.

In the present example, the thickness of a film as the electrical insulating substrate 202 is set to be 12 μm and the thickness of each adhesive layer 201 is set to be 5 μm as in the first example. Similarly, the thickness of the wiring layer 207 is set to be 9 μm as in the first example. That is to say, the total thickness of the adhesive layers and the thickness of the wiring layer 207 are set to be substantially the same. This allows the substrate 202 to be deformed sufficiently in forcing the wiring layer 207 into the adhesive layer 201. Therefore, the through holes in the adhesive layers 201 are not increased in diameter, thus compressing the conductive paste 205. In this example, a compressibility of 9/22=about 41% is obtained. Actually, the conductive paste with a maximum thickness of that of release films protruded from the surfaces of the adhesive layers 201. Consequently, the compressibility corresponding to the thickness was added, and was therefore further increased. The volume ratio of the resinous constituent and the conductive constituent in the conductive paste 205 was set to be about 50% considering print quality. Therefore, most of the resinous constituent in the conductive paste 205 within the through holes 204 was pressed out in the adhesive layers, and the conductive constituent became dense within the through holes 204, thus obtaining via holes with low resistance and high reliability. From experiments, when the volume compressibility was at least 20%, electric connection with low resistance could be obtained, thus improving the connection reliability.

In the present example, the total thickness of the adhesive layers 201 was substantially the same as the thickness of the wiring layer 207. However, when the wiring layer is thicker than the adhesive layer, further excellent electric connection can be obtained. In this case, adhesives are received between conductors in the wiring layer. Therefore, when the wiring layer is too thick, the portions between the conductors cannot be filled. In addition, the increase in volume of deformation of the electrical insulating substrate is anticipated. The volume of deformation varies depending on the density of the wiring layer, i.e. a ratio of residual copper.

Therefore, in the case of using a porous material, in which spaces capable of receiving constituent materials of adhesive layers provided on both surfaces of an electrical insulating substrate are formed, as the electrical insulating substrate, when the adhesive layers flow due to heating and pressurization, the constituent materials of the melted adhesive layers can be received. Therefore, the volume of deformation of the electrical insulating substrate can be restrained. Thus, the stability in connection can be increased. Further, constituent materials of the adhesive layer beneath the wiring layer are received between patterns of the wiring layer. Therefore, it is conceivable that the amount of the constituent materials to be received between the patterns varies depending on the pattern arrangement. However, since the electrical insulating substrate is provided with spaces capable of receiving the constituent materials of the adhesive layers provided on both the surfaces of the electrical insulating substrate, the variation in amount of the constituent materials to be received can be restrained to the minimum.

Furthermore, in the case of using a porous material having minute pores, through which the constituent materials of the adhesive layers provided on both the surfaces of the electrical insulating substrate can pass, as the electrical insulating substrate, when the adhesive layers flow due to heating and pressurization, the constituent materials of the melted adhesive layers can move up and down in the electrical insulating substrate. Therefore, such an electrical insulating substrate is more effective. Any minute pores are acceptable as long as the pores are minute to such an extent that the conductive constituents in the conductive paste do not flow out. For example, when the conductive constituent is copper powder with a diameter of 10 μm, minute pores with a diameter of about 5 μm are acceptable.

Third Example

A method of manufacturing a multilayer circuit board according to a third example of the present invention will be explained with reference to FIGS. 4(a)–(e).

Figure 4:
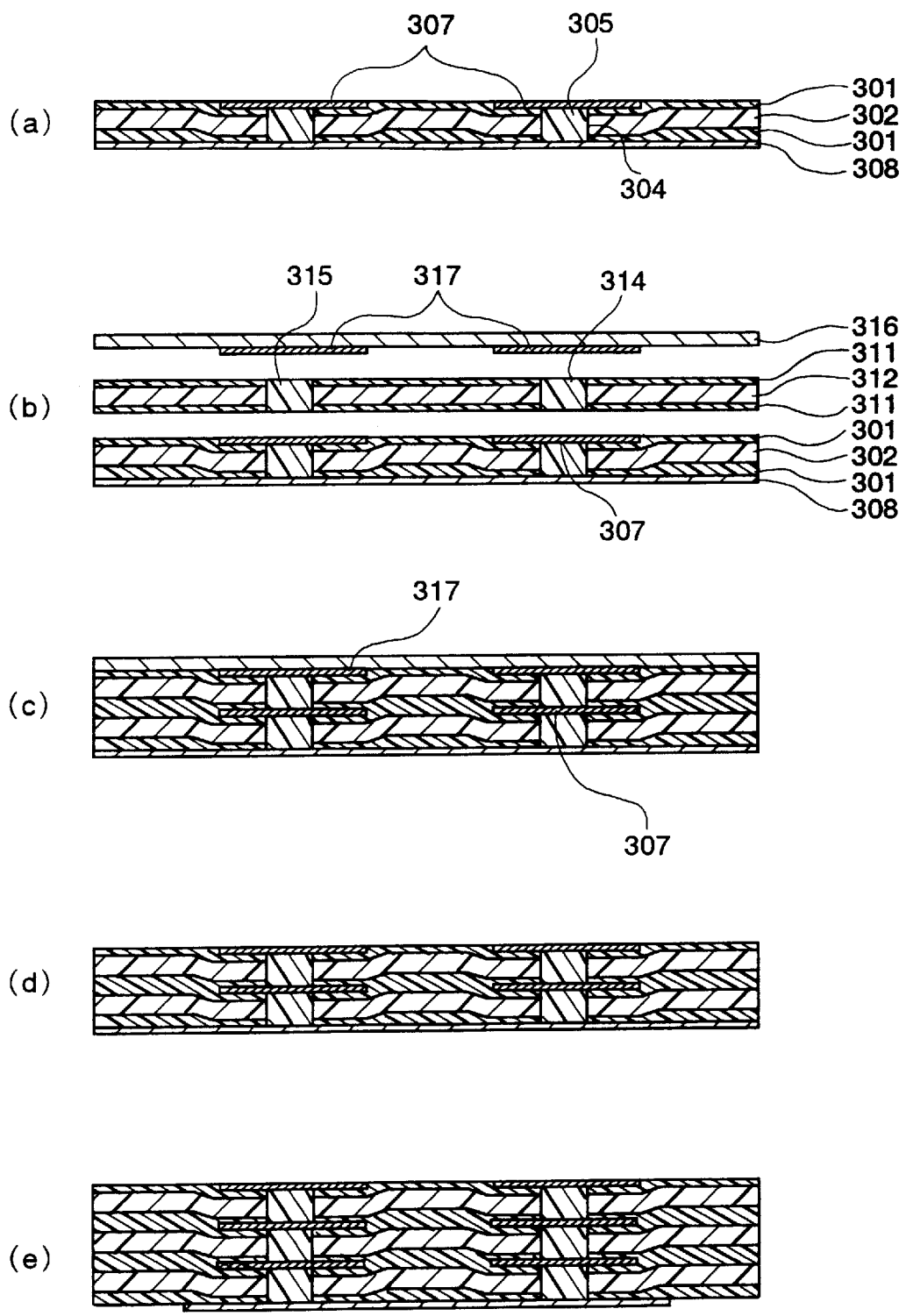
FIGS. 4(a)–(e) show cross-sectional views illustrating steps in a method of manufacturing a multilayer circuit board in a third example of the present invention.

As shown in FIG. 4(a), a double-faced circuit board was manufactured as in the second example. Numerals 301 and 302 indicate adhesive layers and an electrical insulating substrate. A numeral 304 denotes through holes provided in the substrate 302. The through holes 304 are filled with a conductive pate 305. The conductive paste 305 within the through holes 304 is compressed from one side by a wiring layer 307. A numeral 308 indicates a copper foil. On the surface at the side of the wiring layer 307 of the double-faced circuit board formed as mentioned above, an electrical insulating substrate 312 provided with adhesive layers 311 on its both surfaces and through holes 314 filled with a conductive paste 315 at predetermined positions was superposed together with a supporting base 316 with a wiring layer 317 formed in a predetermined pattern as shown in FIG. 4(b). Then, as shown in FIG. 4(c), it was heated and pressurized by vacuum press, thus electrically connecting the wiring layer 307 and the wiring layer 317. After that, as shown in FIG. 4(d), the supporting base 316 was removed. The steps shown in FIGS. 4(b)–4(d) were repeated for a predetermined number of times to laminate a predetermined number of layers. Then, as shown in FIG. 4(e), the copper foil 308 was etched in a predetermined shape, thus completing a multilayer circuit board.

In the multilayer circuit board of the present example, via holes (for example, through holes 314) can be formed on via holes (for example, through holes 304), thus increasing the wiring density. Furthermore, since the surface from which the supporting base 316 has been removed is flat, even lamination of many layers does not cause unevenness on the surface, thus enabling a large number of layers to be laminated.

The multilayer circuit board of the present invention has a smooth surface and is therefore convenient for mounting semiconductor bare chips. The flatness of the actually manufactured multilayer circuit board was ±5 μm in a square with sides of 10 mm in the area where the semiconductor bare chips were to be mounted, which was extremely flat. When semiconductor bare chips were mounted face down, the mounting yield was good due to the excellent flatness of the surface under the chips, thus improving mounting reliability.

In the method of manufacturing a multilayer circuit board of the present invention, the layers are laminated on the copper foil 308. Therefore, a change in size after the lamination can be restrained. Thus, dislocation can be suppressed even in the case where a large number of layers are laminated, which enables the design with a precise design rule.

The method of manufacturing the supporting base 106 (or 206, 316) with the wiring layer 107 (or 207, 317) in the aforementioned first to third examples was explained with reference to FIG. 2, but the following methods also can be employed.

Production Method 1

Figure 5:
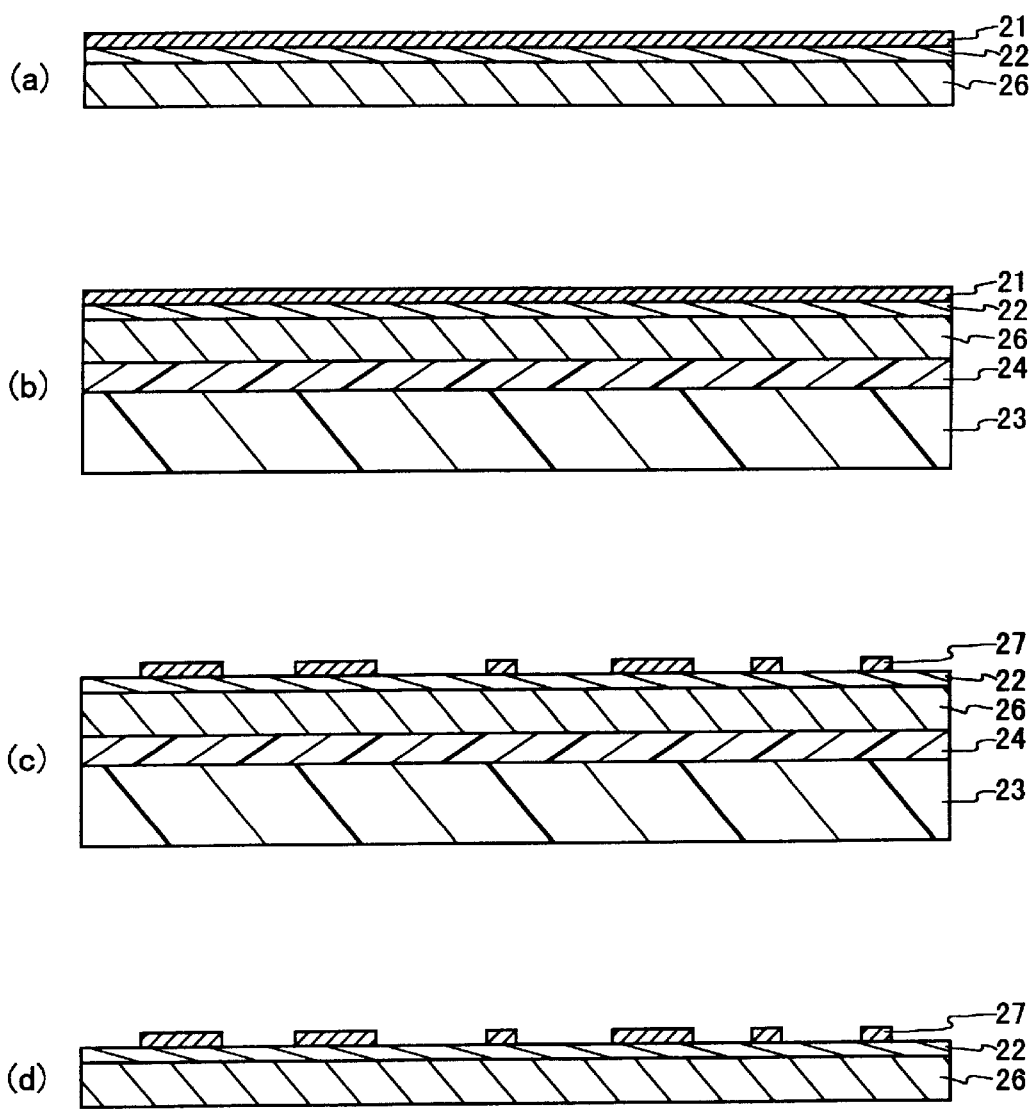
FIGS. 5(a)–(d) show cross-sectional views illustrating steps in another example of the method of manufacturing a supporting base on which a wiring layer of the present invention has been formed.

As shown in FIG. 5(a), using a copper foil with a thickness of about 18 μm, which can be removed by etching easily in a later step, as a supporting base 26, a nickel layer with a thickness of about 3 μm having no pin hole or the like was formed as an etching-stopper layer 22 on the copper foil 26 by plating, deposition, bonding, or the like. Further, a metal layer 21 made of copper as a wiring layer material was formed on the nickel layer 22 by plating, deposition, bonding, or the like. In this case, the metal layer 21 is required to have a thickness that satisfies electric characteristics as a wiring layer, is not affected by side etching or the like in a later etching step, and thus enables a minute pattern to be formed. Considering this, the metal layer 21 was formed to be about 10 μm in the present production method.

Figure 2:
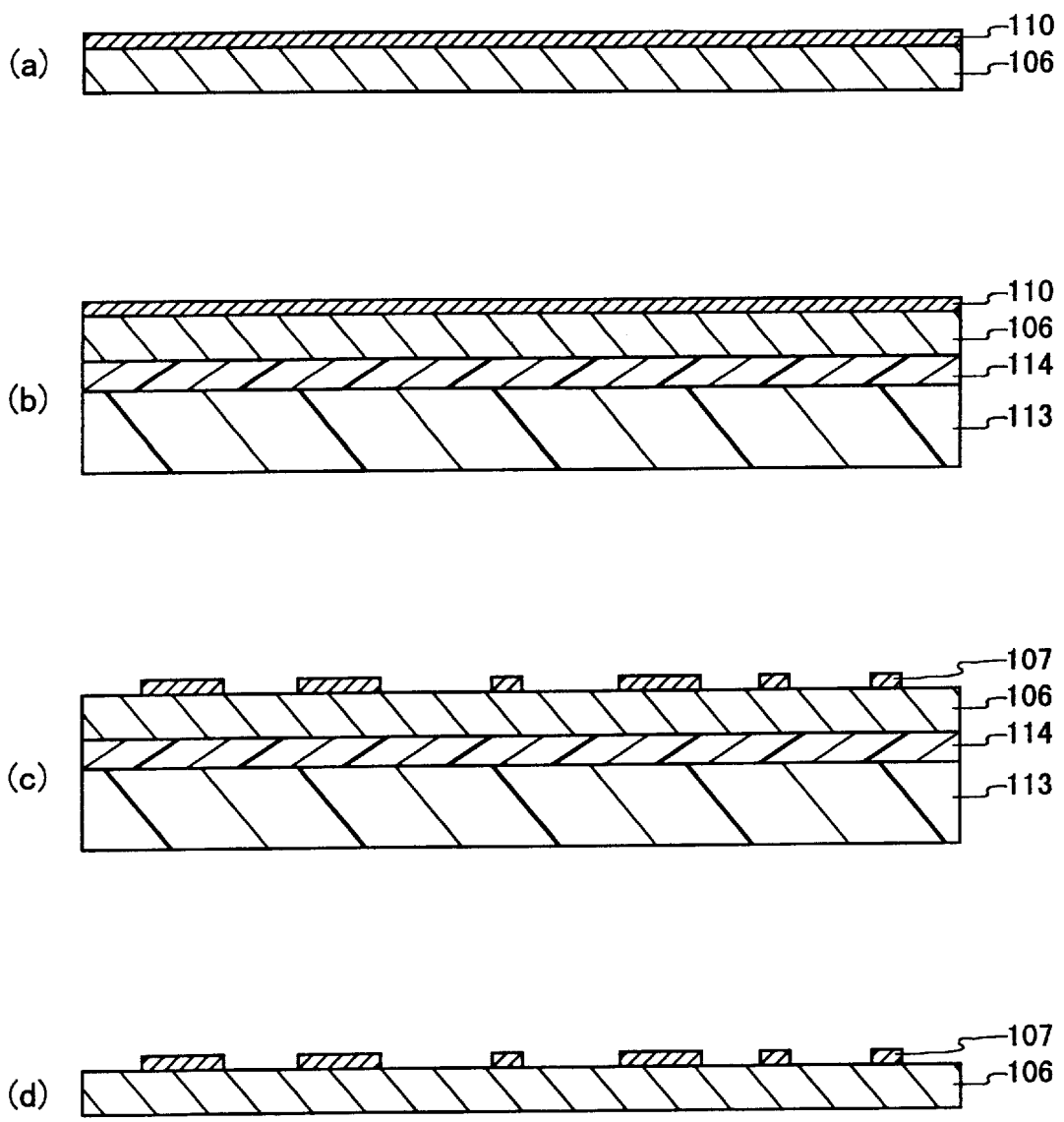
FIGS. 2(a)–(d) show cross-sectional views illustrating steps in an example of a method of manufacturing a supporting base on which a wiring layer of the present invention has been formed.

As a next step, as in the case shown in FIG. 2, a substrate 23 formed of a PET film was bonded to the surface of the supporting base 26 opposite the surface on which the nickel layer 22 and the copper layer 21 had been laminated, using an adhesive 24 containing a foaming agent (FIG. 5(b)).

Then, the copper of the metal layer 21 of the top surface was photo-etched to form a wiring layer 27 with a desired pattern (FIG. 5(c)). As an etchant, an ammonium persulfate solution was used. In this case, since the nickel of the etching-stopper layer 22 was not etched by the ammonium persulfate solution, only the copper of the metal layer 21 was etched. The copper of the supporting base 26 was protected by the substrate 23 from the back side and therefore was not attacked at all.

After that, the temperature was increased to a predetermined temperature by heating. This caused the foaming agent to foam and thus the adhesive 24 lost its adhesion. As a result, the substrate 23 and the supporting base 26 were easily separated at the bonded interface. Thus, a layered product in which the supporting base 26, the etching-stopper layer 22, and the wiring layer 27 made of copper with a desired pattern were laminated sequentially was obtained (FIG. 5(d)).

The layered product obtained in the present production method was used instead of each supporting base 106 with the wiring layer 107 in the first example and was heated and pressurized as in the first example. The wiring layers 27 were embedded in the adhesive layers 101, and the wiring layers 27 on both the surfaces of the electrical insulating substrate 102 were electrically connected to each other.

The copper of the supporting substrates 26 was etched using an ammonium persulfate solution and then the nickel layer 22 was etched using a hydrochloric acid solution to be removed separately, thus obtaining a double-faced circuit board in which the wiring layers 27 had been embedded in the adhesive layers 101.

In the above example, copper was used for the supporting substrate 26. However, any material can be used as long as the etchant used for the material is different from that used for the etching-stopper layer 22. Therefore, aluminum may be used. Further, as the etching-stopper layer 22, iron, chromium, or the like can be used instead of nickel. Depending on the selection of the etchants, the respective materials can be combined variously.

The steps of embedding the wiring layers 27 in the adhesive layers 101 and separating the substrates 23 can be carried out simultaneously by: laminating the layered bodies in the state shown in FIG. 5(c) on the electrical insulating substrate 102 without peeling and removing the substrates 23 by heating (see FIG. 1 (f)); and when heating and pressurizing it, increasing temperature to at least a temperature that enables the foaming agent contained in the adhesive 24 to foam.

Production Method 2

Figure 6:
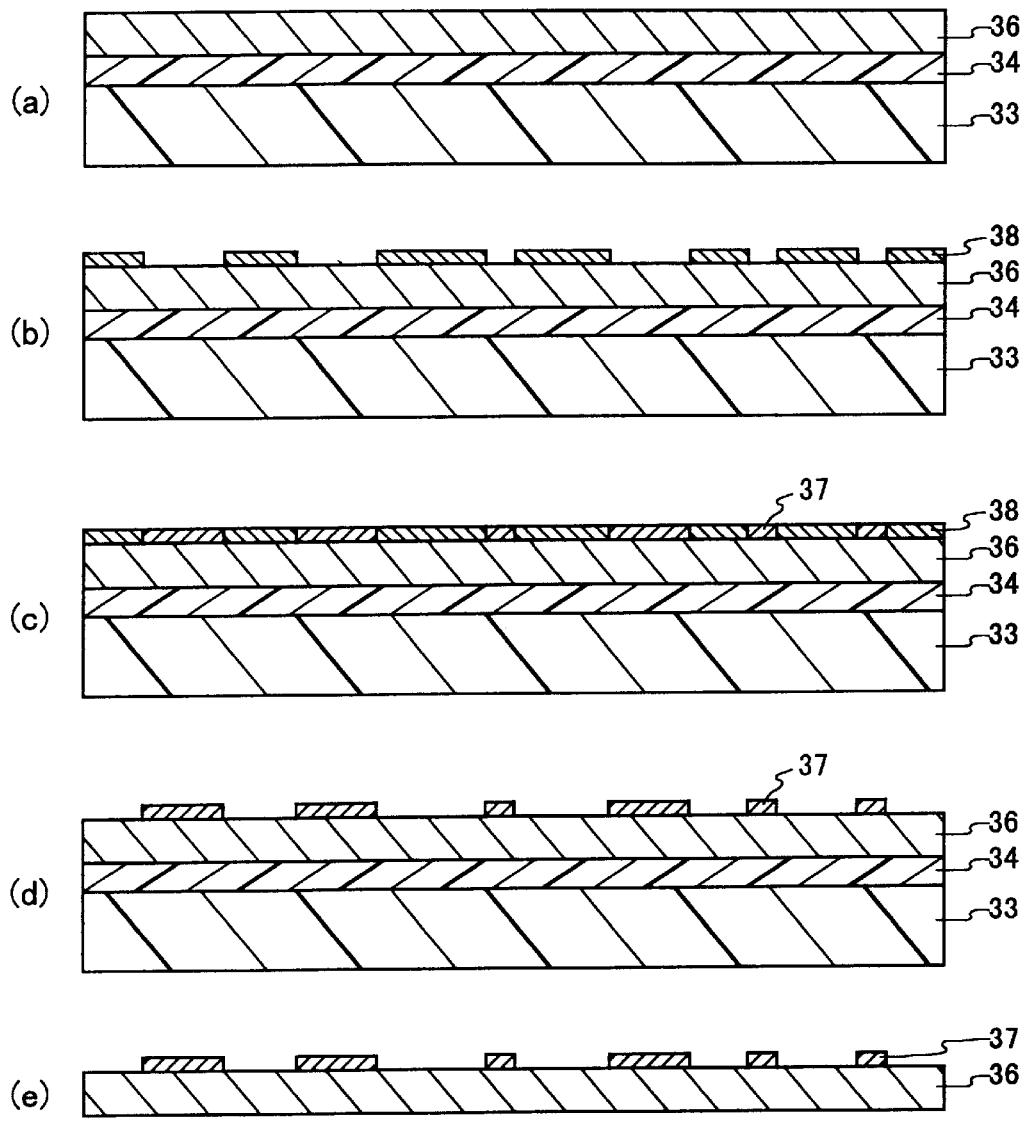
FIGS. 6(a)–(e) show cross-sectional views illustrating steps in a further example of the method of manufacturing a supporting base on which a wiring layer of the present invention has been formed.

As shown in FIG. 6(a), a substrate 33 was bonded to the back surface of a supporting base 36 made of aluminum using an adhesive 34 containing a foaming agent.

Then, in order to carry out pattern formation on the surface of the aluminum of the supporting base 36 using an insulating material, a photosensitive resin layer as the insulating material was formed to have a thickness of about 10 μm. The photosensitive resin layer can be formed by spinner, roll coat, or the like. The photosensitive resin layer was exposed and developed using a mask with a desired pattern, thus forming a photosensitive resin pattern 38 on the surface of the supporting base 36 (FIG. 6(b)).

As a next step, the exposed surface of the supporting base 36 was copper-plated to form a wiring layer 37 made of copper having a desired pattern (FIG. 6(c)).

In this case, when the plating is carried out by non-electroplating, copper also grows on the photosensitive resin pattern 38. Then, in removing the photosensitive resin, the copper that has grown on the photosensitive resin pattern 38 can be removed together with the photosensitive resin (so called "lift-off"). However, when the photosensitive resin is not sufficiently thicker than the copper to be plated, the photosensitive resin is covered by the copper. Therefore, the photosensitive resin cannot be removed well, which may lead to failure in obtaining a wiring layer with a desired pattern.

However, in the case of electroplating, copper does not adhere onto the area of the photosensitive resin pattern 38 of an electrical insulating material. Therefore, the electroplating enables copper easily to adhere selectively onto only the area where the surface of the supporting base 36 is exposed. The etching-stopper layer explained in Production Method 1 may be laminated between the supporting base 36 and the photosensitive resin pattern 38. However, in this case, the etching-stopper layer must be made of a conductive material.

After that, the photosensitive resin pattern 38 was removed using a sodium hydroxide solution of about 3 wt % (FIG. 6(d)).

Then, the temperature was increased to a predetermined temperature by heating to allow the foaming agent contained in the adhesive 34 to foam, thus peeling off the substrate 33. As a result, the supporting base 36 on which the wiring layer 37 formed of copper had been formed in a desired pattern was obtained (FIG. 6(e)).

The adhesion of the copper by plating in the present production method enables the pattern formation precisely according to a resist pattern, since side etching is not caused as in etching. Thus, the present production method is advantageous in forming a minute pattern.

In the above, the layered body in the state shown in FIG. 6(d) may be laminated on an electrical insulating substrate without peeling and removing the substrate 33 by heating and then may be heated and pressurized to peel off the substrate 33 as in Production Method 1.

Fourth Example

Figure 7:
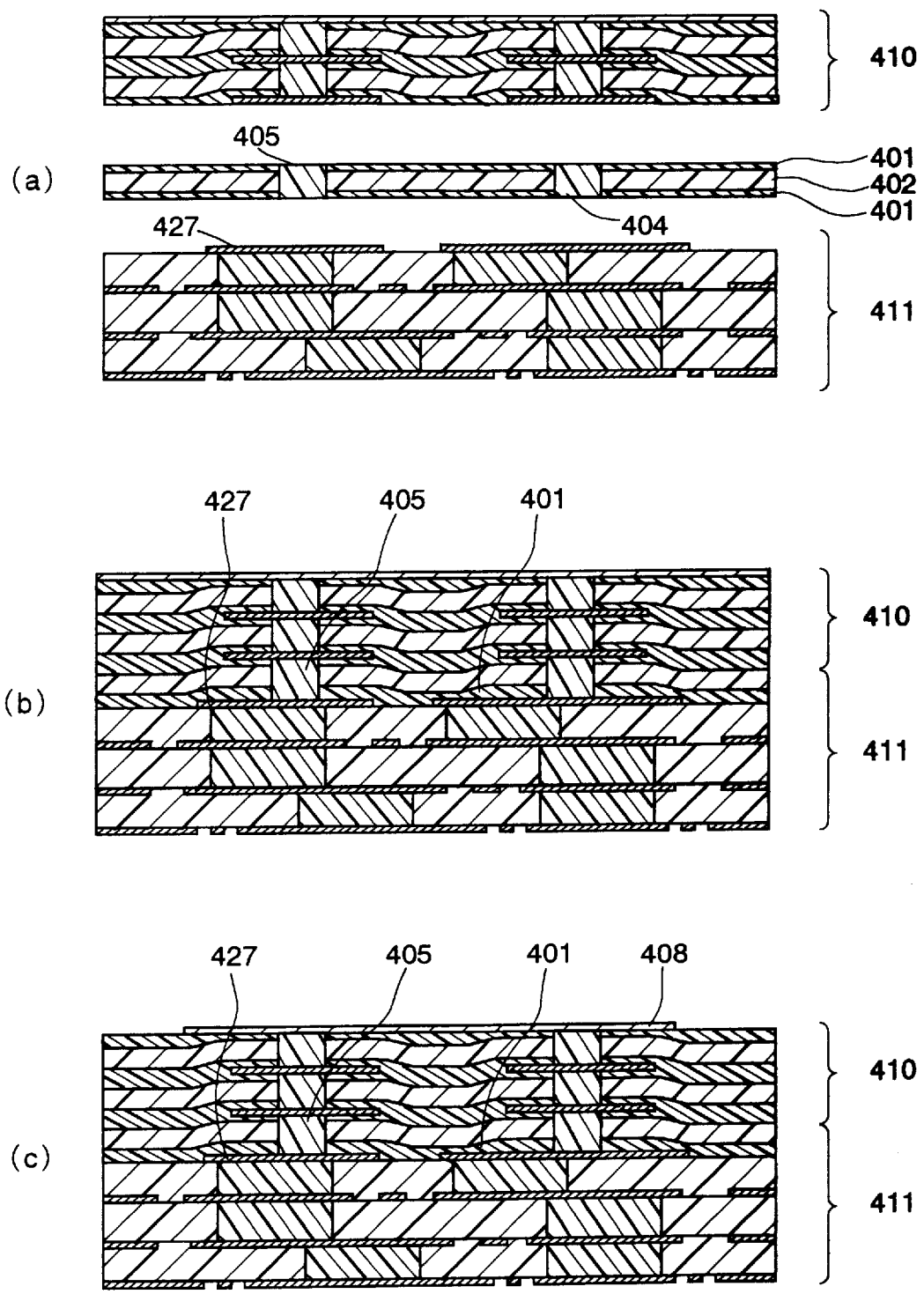
FIGS. 7(a)–(c) show cross-sectional views illustrating steps in a method of manufacturing a multilayer circuit board in a fourth example of the present invention.
Figure 8:
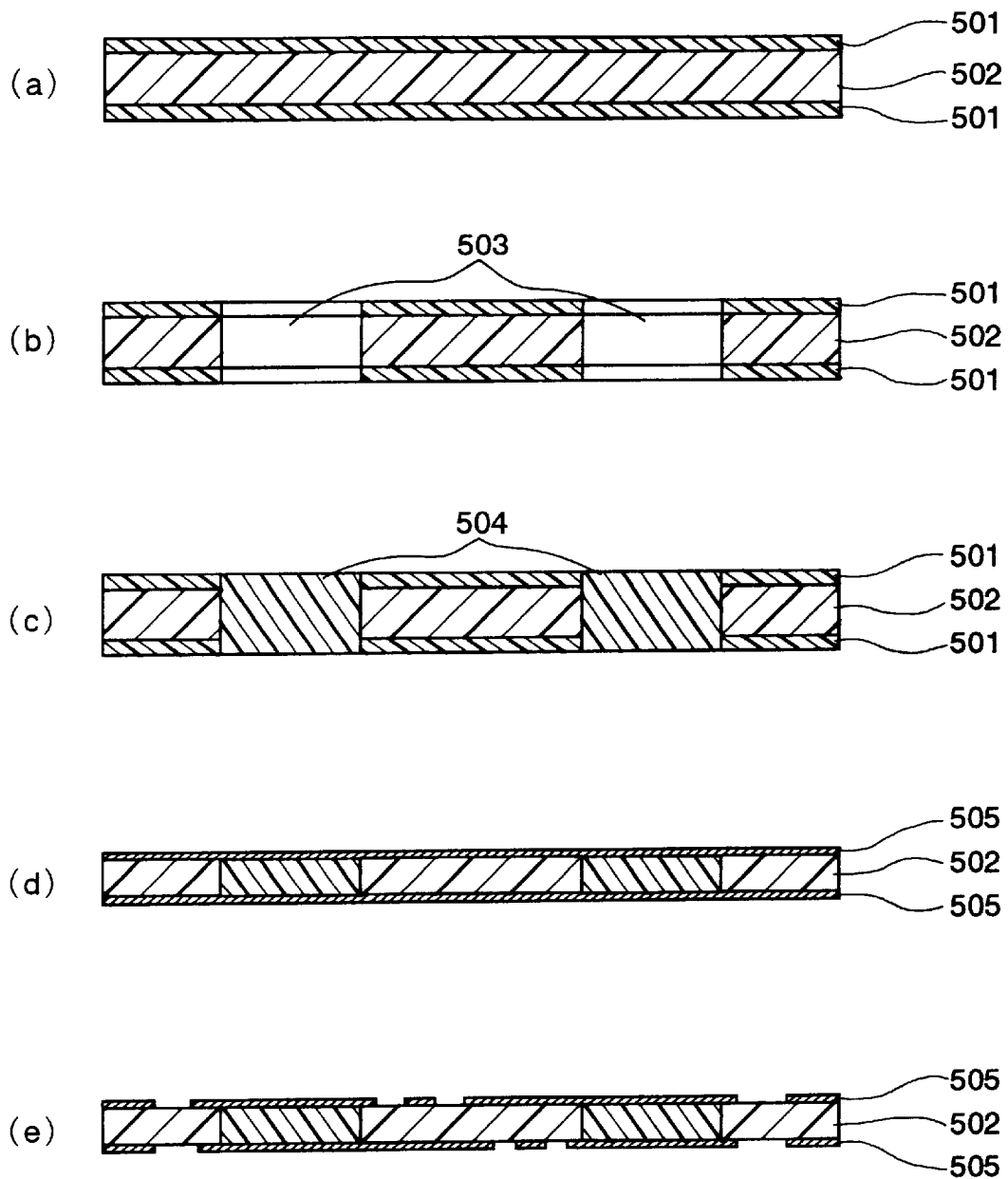
FIGS. 8(a)–(e) show cross-sectional views illustrating steps in a method of manufacturing a conventional multilayer circuit board (an ALIVH substrate).

A method of manufacturing a multilayer circuit board according to a fourth example of the present invention will be explained with reference to FIG. 7.

As a first step, a multilayer circuit board 410 produced as in the third example and a core substrate 411 having a predetermined number of insulating layers and wiring layers were prepared. The present example will be explained by an example using the multilayer circuit board explained in the conventional example as the core substrate 411. As shown in FIG. 7(a), the multilayer circuit board 410 and the core substrate 411 were superposed with an electrical insulating substrate 402 being sandwiched therebetween. The substrate 402 has adhesive layers 401 on its both surfaces and through holes 404 filled with a conductive paste 405 at predetermined positions. The substrate 402 was obtained by carrying out the same steps as those shown in FIG. 1(a)–(e) in the first example. After that, as shown in FIG. 7(b), a conductor 427 on the top layer of the core substrate 411 was embedded in the adhesive layer 401 by heating and pressurization to compress the conductive paste 405 within the through holes 404. Thus, the multilayer circuit board 410 and the core substrate 411 were electrically connected to each other. As the last step, as shown in FIG. 7(c), a copper foil 408 of the top layer of the multilayer circuit board 410 was etched selectively in a predetermined shape, thus completing a multilayer circuit board with a minute wiring pattern on its top layer.

The above-mentioned multilayer circuit board is excellent in the wiring formation at a high density. The wiring density was further increased by providing the minute wiring pattern on the top layer. In order to mount semiconductor bare chips, minute wiring corresponding to its pad pitch is required on the top layer. The above-mentioned multilayer circuit board is suitable even for mounting such semiconductor bare chips.

In the present example, the multilayer circuit board 410 was provided on one surface of the above-mentioned multilayer circuit board as the core substrate 411. However, it is advantageous in preventing warp or the like of the whole wiring board to provide the multilayer circuit boards 410 on both the surfaces.

In the multilayer circuit board of the present invention, the aforementioned multilayer circuit board explained in the conventional example was used as the core substrate 411. However, the core substrate 411 is not limited to that. For instance, a glass epoxy multilayer circuit board can be used as the core substrate 411. In this case, compared to a so-called build-up circuit board in which minute wiring is formed on a glass epoxy multilayer circuit board, the following effects are obtained.

(1) A minute wiring layer can be formed on a copper foil in a separate process. Therefore, the degree of freedom in process conditions or the like increases, thus providing high performance.

(2) After the formation of the minute wiring layer on the copper foil, the minute wiring layer is superposed on a core substrate to be transferred, thus enabling rough positioning and therefore improving the yield. In addition, one with a large area can be manufactured.

In a multilayer circuit board formed by transferring a wiring layer to the top layer, a film base with high heat-resistance and high stiffness can be used as described in the first to third examples. Therefore, the multilayer circuit board can withstand a heat treatment in mounting semiconductor bare chips, and the change in size also can be restrained.

When using the method of manufacturing a multilayer circuit board of the present example, the multilayer circuit board 410 of the top layer and the core substrate 411 can be manufactured and tested separately. Therefore, the general yield can be improved. Furthermore, since an electrical insulating substrate with minute through holes is used as a connecting member, positioning accuracy is not strictly limited, which enables easy manufacture.

In the present example, the wiring layer 427 of the top layer of the core substrate 411 was embedded in the adhesive layer 401. However, the multilayer circuit board shown in FIG. 4(e) that was manufactured as in the third example may be laminated with the wiring layer formed of a copper foil 308 that has been selectively etched facing the electrical insulating substrate 402. In this case, the wiring layer of the top layer of the substrate 410 is embedded in the adhesive layer 401. Consequently, the wiring layer formed of the copper foil 308 can compress the conductive paste 405 within the through holes 404, thus obtaining the same effect as the above.

In the above, the supporting base 316 can be removed at the end after embedding the wiring layer 308 of the top layer of the multilayer circuit board 410 in the adhesive layer 401 by heating and pressurization without removing the supporting base 316. In this case, the supporting base 316 protects the minute wiring layer of the top layer until the step just before completing the multilayer circuit board of the present example including the heating and pressurizing step. Therefore, it is advantageous in manufacture.

Moreover, both the wiring layer 427 of the top layer of the core substrate 411 and the wiring layer 308 of the top layer of the multilayer circuit board 410 may be embedded in the adhesive layers 401. In this case, the conductive paste 405 within the through holes 404 is compressed from both sides. As a result, the amount of compressing the conductive paste increases, thus further improving the reliability in connection by the conductive paste.

Fifth Example

A multilayer circuit board was manufactured using a substrate bonding body having compressibility, which has through holes filled with a conductive paste and formed at predetermined positions, instead of the electrical insulating substrate 402 having adhesive layers on its both surfaces and the through holes 404 filled with the conductive paste 405 in the fourth example.

As a constituent material of the substrate bonding body, an electrical insulating material, for example, a glass epoxy resin, a phenol resin, a polyimide resin, a polyester resin, an aramide resin, or the like can be used. However, a pre-preg formed by impregnating an aramide nonwoven fabric with epoxy resin and bringing it into a semi-cured state (in a B stage state) can be used in general. By laser processing, through holes are provided in the pre-preg at predetermined positions. The through holes are filled with a conductive paste containing a conductive constituent such as Ag, Cu, an alloy of Ag and Cu, or the like. In this case, when the conductive paste is formed so as to protrude from the surfaces of the substrate bonding body, the conductive paste is compressed favorably. Consequently, the multilayer circuit board 410 and the core substrate 411 can be electrically connected with low resistance. In the present example, a pre-preg with a thickness of about 0.1 mm that was obtained by impregnating a nonwoven fabric formed of aramid fibers with an epoxy resin was processed to have through holes at desired positions using a $CO_2$ laser. Then, the through holes were filled with a Cu paste so that the Cu paste protruded from the surfaces slightly.

As a next step, the multilayer circuit board 410, the aforementioned substrate bonding body, and the core substrate 411 were heated to be compressed at a temperature of 200° C. and a pressure of 45–55 kg/cm$^2$ for 60 minutes. As a result, the conductor 427 that protruded from the surface of the core substrate 411 was immersed into the epoxy resin of the substrate bonding body. Simultaneously, the conductive paste was sandwiched by the wiring layer of the multilayer circuit board 410 and the conductor 427 on the surface of the core substrate 411. Therefore, the conductive paste filling the inside the through holes was compressed, thus electrically connecting the wiring layer and the conductor 427.

In the present example, the conductor 427 protruding from the surface of the core substrate 411 was embedded in the substrate bonding body. However, as in the fourth example, a wiring layer protruding from the surface of the multilayer circuit board 410 to be laminated may be preformed, which provides the same effect. Further, both the conductor 427 protruding from the surface of the core substrate 411 and the wiring layer protruding from the surface of the multilayer circuit board 410 may be embedded in the substrate bonding body. In this case, the conductive paste within the through holes is compressed from both sides. As a result, the amount of compressing of the conductive paste increases, thus further improving the reliability in connection by the conductive paste.

Moreover, when the surface of the wiring layer of the multilayer circuit board 410 that comes into contact with the conductive paste and the surface of the conductor 427 on the surface of the core substrate 411 are processed to be rough, the reliability in the connection by the conductive paste improves. In the present example, before the heating and pressurization, a blackening process was carried out on the surface of the wiring layer of the multilayer circuit board 410 and the surface of the conductor 427 of the core substrate 411 using sodium hydroxide 15 g/liter, sodium phosphate 12 g/liter, and sodium chlorite 30 g/liter, thus obtaining rough surfaces with a roughness of about 0.5 μm. A film produced on the surface of the copper foil by the blackening process is an insulating film. However, the insulating film is extremely thin and therefore is easily broken by heating and pressurization, thus enabling conduction.

Furthermore, as a method of roughening a surface, copper electroplating also can be employed. That is, a method in which copper is abnormally precipitated in a nodule shape by increasing current density to be higher than that of the condition for producing a copper foil has been well known in general. When using this method, a film produced on the surface of the copper foil is made of copper, thus obtaining further stable electric connection.

The invention may be embodied in other forms without departing from the spirit or essential characteristics thereof. The embodiments disclosed in this application are to be considered in all respects as illustrative and not limiting. The scope of the invention is indicated by the appended claims rather than by the foregoing description, and all changes which come within the meaning and range of equivalency of the claims are intended to be embraced therein.

What is claimed is:

1. A circuit board comprising:
    an electrical insulating substrate with through holes that are formed in a thickness direction of the electrical insulating substrate and are filled with a conductive paste comprising a resinous constituent;
    wiring layers that are formed on both surfaces of the electrical insulating substrate in a predetermined pattern and are electrically connected to each other by the conductive paste; and
    adhesive layers that are formed on both surfaces of the electrical insulating substrate,
    wherein at least one of the wiring layers is embedded in one of the adhesive layers, and the resinous constituent contained in the conductive paste is present between the wiring layers and the electrical insulating substrate.

2. The circuit board according to claim 1, wherein the through holes are covered with the wiring layers.

3. The circuit board according to claim 1, wherein the wiring layers are formed so that a part of the through holes is not covered by the wiring layers.

4. The circuit board according to claim 1, wherein at least a surface of each wiring layer facing the through holes is processed to be rough.

5. A multilayer circuit board comprising:

at least two electrical insulating substrates having through holes formed in a thickness direction and filled with a conductive paste comprising a resinous constituent; and a first adhesive layer, wherein the electrical insulating substrates are laminated with the first adhesive layer being sandwiched therebetween, the first adhesive layer comprises a first wiring layer formed in a predetermined pattern, the first wiring layer is electrically connected to the conductive paste in both the electrical insulating substrates sandwiching the first wiring layer by applying a compressive force in a lamination direction, a second adhesive layer is laminated on a surface of at least one of the electrical insulating substrates of an outermost layer, a second wiring layer is embedded in the second adhesive layer, the second wiring layer is electrically connected to the conductive paste in the electrical insulating substrate of the outermost layer, and the resinous constituent contained in the conductive paste is present between the second wiring layer and the electrical insulating substrate of the outermost layer.

6. A multilayer circuit board assembly comprising:

an electrical insulating substrate having adhesive layers on its both surfaces and through holes filled with a conductor, the multilayer circuit board according to claim 5; and a core substrate having a predetermined number of insulating layers and wiring layers, wherein the second wiring layer of the multilayer circuit board and a wiring layer of a top layer of the core substrate are electrically connected with the electrical insulating substrate being sandwiched therebetween, and at least one selected from the second wiring layer of the multilayer circuit board and the wiring layer of the top layer of the core substrate is embedded in the adhesive layer.

7. A multilayer circuit board assembly comprising:

the multilayer circuit board according to claim 5;

a core substrate having a predetermined number of insulating layers and wiring layers; and a substrate bonding body having through holes filled with a conductor, wherein the multilayer circuit board and the core substrate are laminated with the substrate bonding body being sandwiched therebetween, the second wiring layer of the multilayer circuit board and the wiring layer of the top layer of the core substrate are electrically connected via the conductor, and the substrate bonding body before being laminated is compressible.

8. The multilayer circuit board assembly according to claim 7, wherein a material forming the substrate bonding body is at least one material selected from resin-impregnated fiber sheet materials composed of a composite material of a glass-fiber nonwoven fabric or an organic-fiber nonwoven fabric, and a thermosetting resin.

9. A circuit board comprising:

an electrical insulating substrate with through holes that are formed in a thickness direction of the electrical insulating substrate and are filled with a conductor;

wiring layers that are formed on both surfaces of the electrical insulating substrate in a predetermined pattern and are electrically connected to each other by the conductor; and adhesive layers that are formed on both surfaces of the electrical insulating substrate;

wherein the electrical insulating substrate is formed of a film comprising an organic material as a main constituent, the adhesive layers are formed of an organic resin, at least one of the wiring layers is embedded in one of the adhesive layers, and the film is distorted in its thickness direction.

10. The circuit board according to claim 9, wherein the through holes are covered with the wiring layers.

11. The circuit board according to claim 9, wherein the wiring layers are formed so that a part of the through holes is not covered by the wiring layers.

12. The circuit board according to claim 9, wherein at least a surface of each wiring layer facing the through holes is processed to be rough.

13. A multilayer circuit board comprising:

at least two electrical insulating substrates having through holes formed in a thickness direction and filled with conductors; and an adhesive layer, wherein the electrical insulating substrates are laminated with the adhesive layer being sandwiched therebetween, the electrical insulating substrate is formed of a film comprising an organic material as a main constituent, the adhesive layer is formed of an organic resin, the adhesive layer comprises a wiring layer formed in a predetermined pattern, the wiring layer is electrically connected to the conductors in both the electrical insulating substrates sandwiching the wiring layer by applying a compressive force in a lamination direction, and the film is distorted in its thickness direction.

* * * * *